United States Patent
Choi et al.

(10) Patent No.: US 8,003,173 B2
(45) Date of Patent: Aug. 23, 2011

(54) METHOD FOR FORMING A PHOTORESIST-LAMINATED SUBSTRATE, METHOD FOR PLATING AN INSULATING SUBSTRATE, METHOD FOR SURFACE TREATING OF A METAL LAYER OF A CIRCUIT BOARD, AND METHOD FOR MANUFACTURING A MULTI LAYER CERAMIC CONDENSER USING METAL NANOPARTICLES AEROSOL

(75) Inventors: Hee-Sung Choi, Suwon-si (KR);
Bae-Kyun Kim, Seongnam-si (KR);
Mi-Yang Kim, Suwon-si (KR);
Seoung-Jae Lee, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 855 days.

(21) Appl. No.: 12/003,991

(22) Filed: Jan. 4, 2008

(65) Prior Publication Data
US 2008/0220373 A1 Sep. 11, 2008

(30) Foreign Application Priority Data
Mar. 7, 2007 (KR) .................. 10-2007-0022563

(51) Int. Cl.
*C23C 4/08* (2006.01)
*B05D 1/04* (2006.01)
*B05D 1/06* (2006.01)
*B05D 1/10* (2006.01)
*B32B 37/00* (2006.01)

(52) U.S. Cl. ........ 427/456; 427/455; 427/457; 427/475; 427/180; 427/203; 427/405; 427/427

(58) Field of Classification Search .................. 427/448, 427/456

See application file for complete search history.

(56) References Cited

U.S. PATENT DOCUMENTS

| | | | | |
|---|---|---|---|---|
| 4,424,408 | A | * | 1/1984 | Elarde ........................... 174/257 |
| 5,302,414 | A | * | 4/1994 | Alkhimov et al. ............. 427/192 |
| 5,964,395 | A | * | 10/1999 | Glovatsky et al. .......... 228/123.1 |
| 6,640,434 | B1 | * | 11/2003 | Wojewnik et al. .............. 29/846 |
| 2001/0004473 | A1 | * | 6/2001 | Strutt et al. .................... 427/446 |

(Continued)

FOREIGN PATENT DOCUMENTS

JP 08-111474 4/1996

(Continued)

OTHER PUBLICATIONS

Japanese Office Action, w/ partial English translation thereof, issued in Japanese Patent Application No. JP 2008-055050 dated Jun. 8, 2010.

*Primary Examiner* — Katherine A Bareford
(74) *Attorney, Agent, or Firm* — McDermott Will & Emery LLP

(57) ABSTRACT

The present invention relates to a method for forming a photoresist-laminated substrate including: preparing a laminated substrate having an insulating substrate and a metal layer; coating with an aerosol of metal nanoparticles on the metal layer; laminating a photoresist film on the metal layer coated with the aerosol of metal nanoparticles. The method of the present invention is a environmentally friendly method since an aerosol of metal nanoparticles is used, differentiated from the conventional wet process.

4 Claims, 20 Drawing Sheets

U.S. PATENT DOCUMENTS

2003/0190799 A1 * 10/2003 Kung et al. .................... 438/637
2005/0074597 A1 * 4/2005 Grinberg et al. ........... 428/307.3

FOREIGN PATENT DOCUMENTS

| | | |
|---|---|---|
| JP | 09-148714 | 6/1997 |
| JP | 2000-261144 | 9/2000 |
| JP | 2004-200557 | 7/2004 |
| JP | 2004-342831 | 12/2004 |
| JP | 2006-049923 | 2/2006 |
| JP | 2006-210896 | 8/2006 |
| KR | 10-2005-0063689 | 6/2005 |
| KR | 10-2005-0107489 | 11/2005 |

* cited by examiner

PRIOR ART

PRIOR ART

PRIOR ART

PRIOR ART

PRIOR ART

PRIOR ART

PRIOR ART

PRIOR ART

PRIOR ART

US 8,003,173 B2

METHOD FOR FORMING A PHOTORESIST-LAMINATED SUBSTRATE, METHOD FOR PLATING AN INSULATING SUBSTRATE, METHOD FOR SURFACE TREATING OF A METAL LAYER OF A CIRCUIT BOARD, AND METHOD FOR MANUFACTURING A MULTI LAYER CERAMIC CONDENSER USING METAL NANOPARTICLES AEROSOL

CROSS-REFERENCE TO RELATED APPLICATION

This application claims the benefit of Korean Patent Application No. 10-2007-0022563 filed on Mar. 7, 2007, with the Korea Intellectual Property Office, the contents of which are incorporated here by reference in its entirety.

BACKGROUND

1. Technical Field

The present invention relates to a method for forming a photoresist-laminated substrate, a method for plating an insulating substrate, a method for surface treating of a metal layer of a circuit board, and a method for manufacturing a multi layer ceramic condenser, in particular, to a method for forming a photoresist-laminated substrate, a method for plating an insulating substrate, a method for surface treating a metal layer of a circuit board, and a method for manufacturing a multi layer ceramic condenser which can be environmentally friendly with employing the dry process which uses an aerosol of metal nanoparticles.

2. Description of the Related Art

A conventional method of manufacturing a printed circuit board is a method which repeatedly stacks layers of a conductive metal and an insulating polymer material layer. In this method, electroless plating and electro plating and the like are being used to form electrical circuits of the conductive metal layer and to connect circuits between the upper layer and the lower layer. Recently, a great deal of technical development is under way on imprinting methods and inkjet methods for forming those circuits, and developing on via filling paste for the connection of the upper and the lower circuits and developing on methods have shown fast progress.

FIGS. 1A to 1H present a manufacturing method for a printed circuit board according to the conventional skill. The conventional method for manufacturing a printed circuit board includes electroless plating, laminating of a dry film, exposing, developing, electro plating, peeling and etching. A copper layer 230 is stacked on an insulating substrate 210 and a dry film 250 is then laminated. After the laminated dry film 250 is exposed through the circuit wiring pattern and is developed, the dry film 250 is eliminated selectively and a copper layer 270 is formed on the exposed copper layer 230 by the electro plating. The dry film 250 is peeled and put to etch to form a circuit. Besides this, there is another method for plating a photosensitive resin dry film which is exposed and developed through the pattern.

In order to forming a fine circuit according to the conventional method, it is very important that a dry film, which is sensitive resin, adheres closely to a copper layer. FIGS. 2A to 2C are schematic diagrams illustrating a process for improving adhesion by etching the surface of a copper layer 130 stacked on an insulating layer 110 to form the surface with fine roughness and then laminating a dry film 170. The dry film 170 is pushed into small holes 150 formed on the copper layer 130 so that the adhesion between the dry film 170 and the copper layer 130 is improved.

However, this kind of etching method has a problem which moisture and residual materials are hardly eliminated during the peeling process. Also, the conventional method for manufacturing a printed circuit board including the step of electroless plating and electro plating can be environmental harming because of using the wet plating process.

SUMMARY

On behalf of settle the above-mentioned problems, the invention provides a method for forming a photoresist-laminated substrate using an aerosol of metal nanoparticles.

The invention further provides a method for plating an insulating substrate using an aerosol of metal nanoparticles.

The invention further provides a method for surface treating of a metal layer of a circuit board using an aerosol of metal nanoparticles.

The invention further provides a method for manufacturing a multi layer ceramic condenser using an aerosol of metal nanoparticles.

One aspect of the invention provides a method for forming a photoresist-laminated substrate including:

preparing a laminated substrate having an insulating substrate and a metal layer;

coating with an aerosol of metal nanoparticles on the metal layer; and laminating a photoresist film on the metal layer coated with the aerosol of metal nanoparticles.

Another aspect of the invention provides a method for plating an insulating substrate including:

preparing an insulating substrate; and forming a metal seed layer by applying an aerosol of metal nanoparticles on one side of the insulating substrate.

Another aspect of the invention provides a method for surface treating of a metal layer of a circuit board including:

preparing a circuit board having a metal layer laminated on an insulating substrate;

forming a first metal layer on the metal layer by coating with a first aerosol of metal nanoparticles; and forming a second metal layer on the first metal layer by coating with a second aerosol of metal nanoparticles.

Another aspect of the invention provides a method for manufacturing a multi layer ceramic condenser including:

preparing a laminated substrate having a dielectric layer and an inner electrode; and forming an outer electrode in a particular form by coating with an aerosol of metal nanoparticles to outside the laminated substrate.

DETAILED DESCRIPTION

Figure 1A:
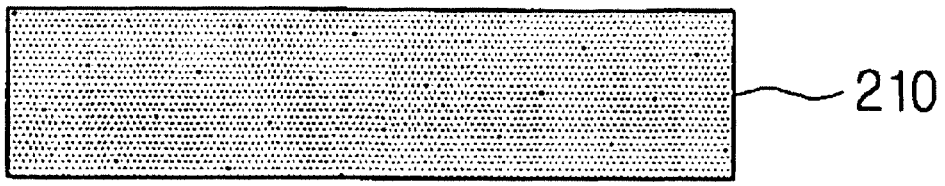
FIGS. 1A to 1H are schematic diagrams illustrating a process of manufacturing a printed circuit board according to prior art.
Figure 1B:
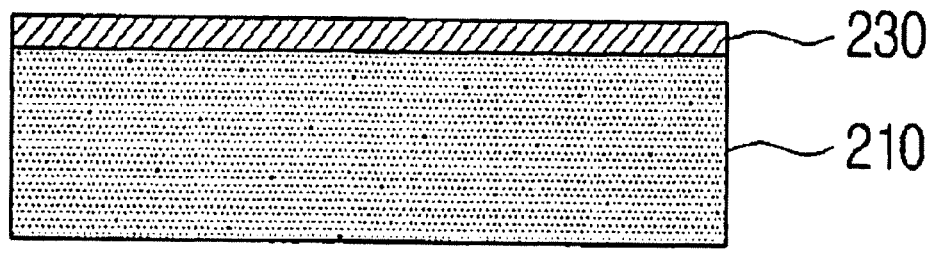
Figure 1C:
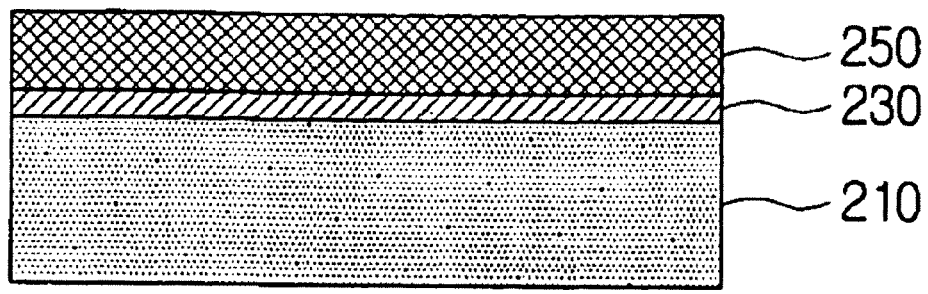
Figure 1D:
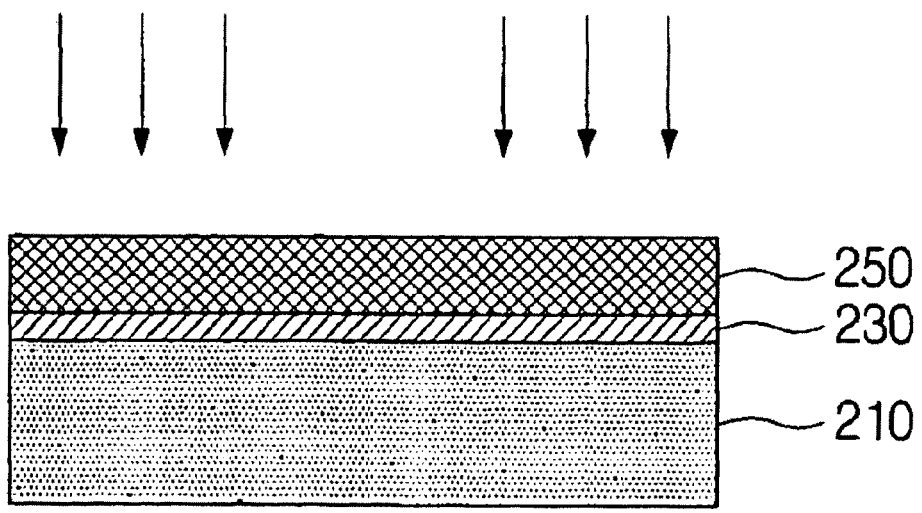
Figure 1E:
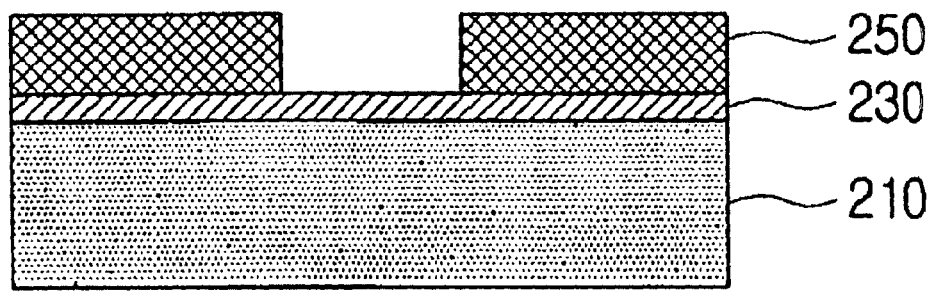
Figure 1F:
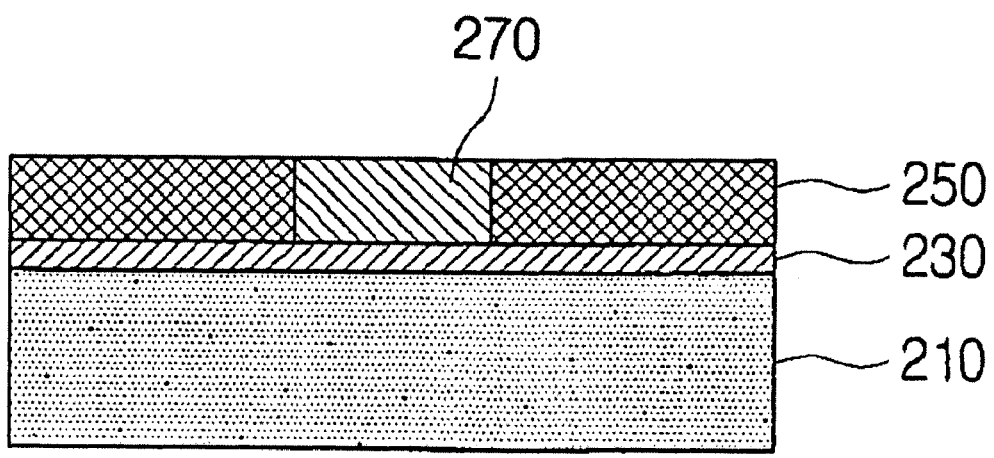
Figure 1G:
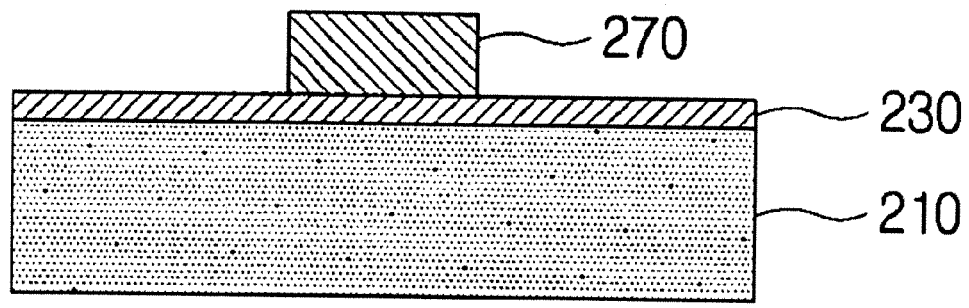
Figure 1H:
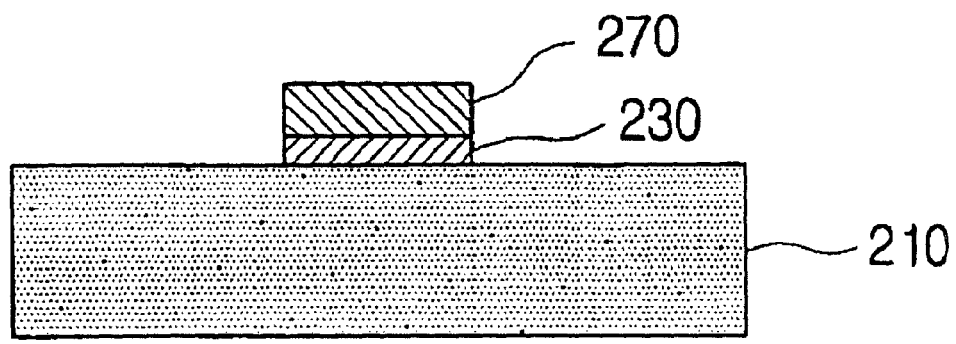
Figure 2A:
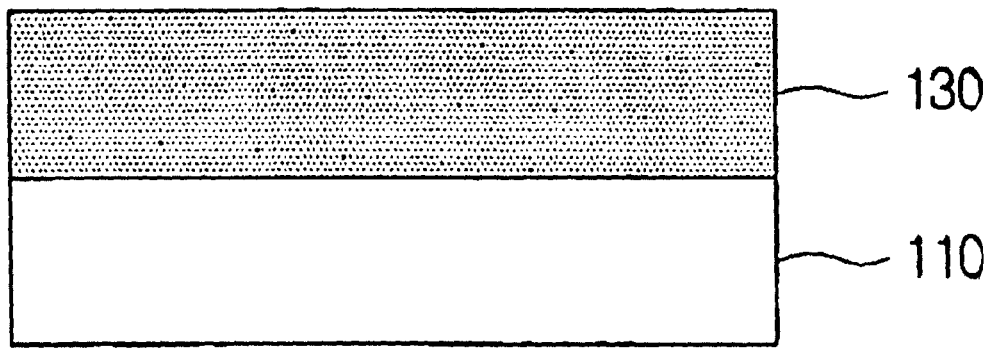
FIGS. 2A to 2C are schematic diagrams illustrating a process of laminating a dry film according to prior art.
Figure 2B:
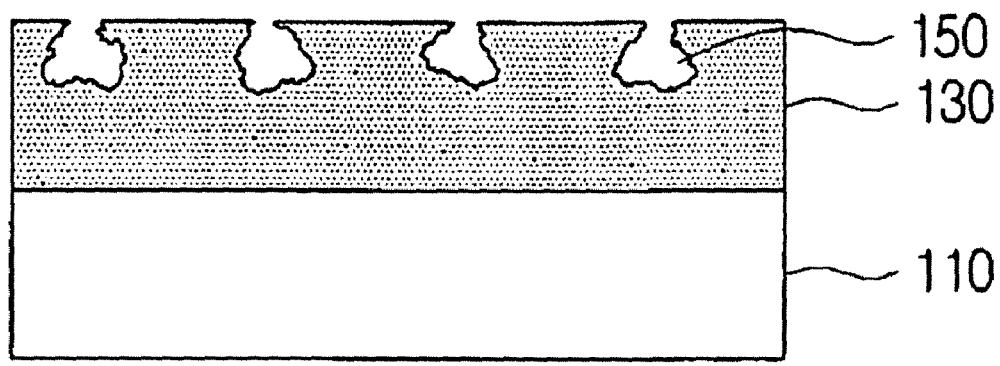
Figure 2C:
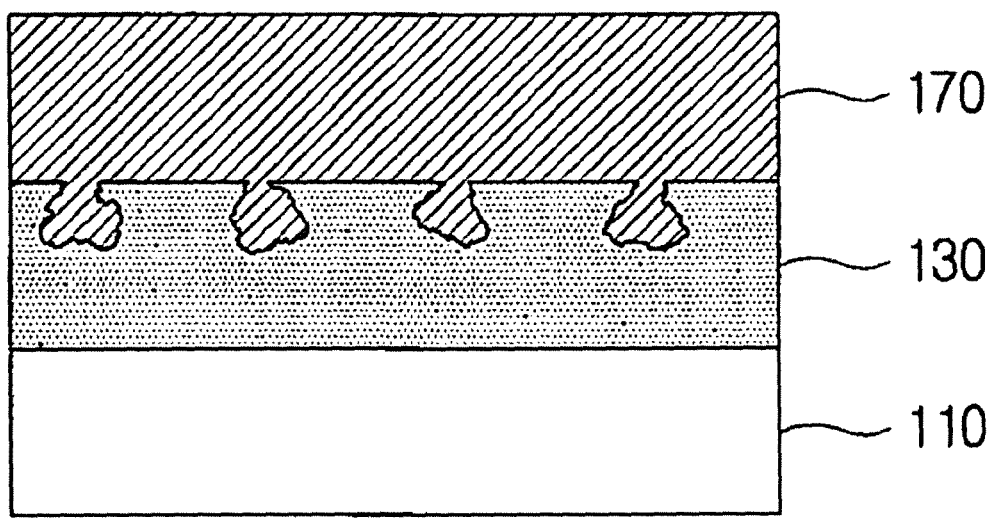
Figure 3A:
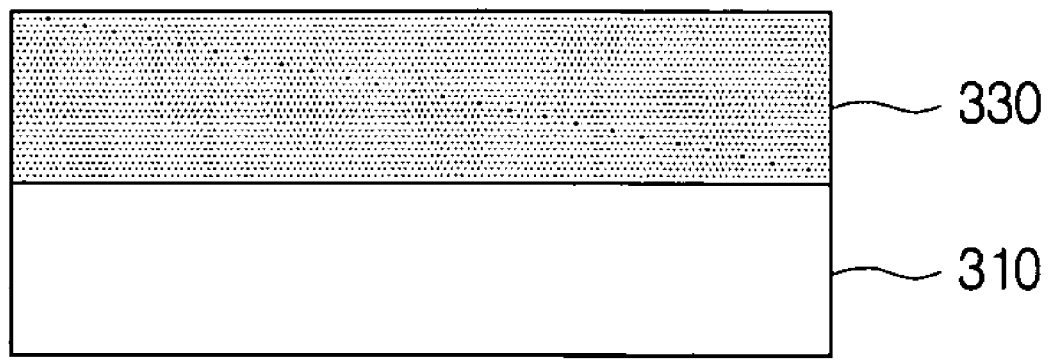
FIGS. 3A to 3D are schematic diagrams illustrating a method of forming a photoresist-laminated substrate using an aerosol of metal nanoparticles according to one embodiment of the present invention.
Figure 3B:
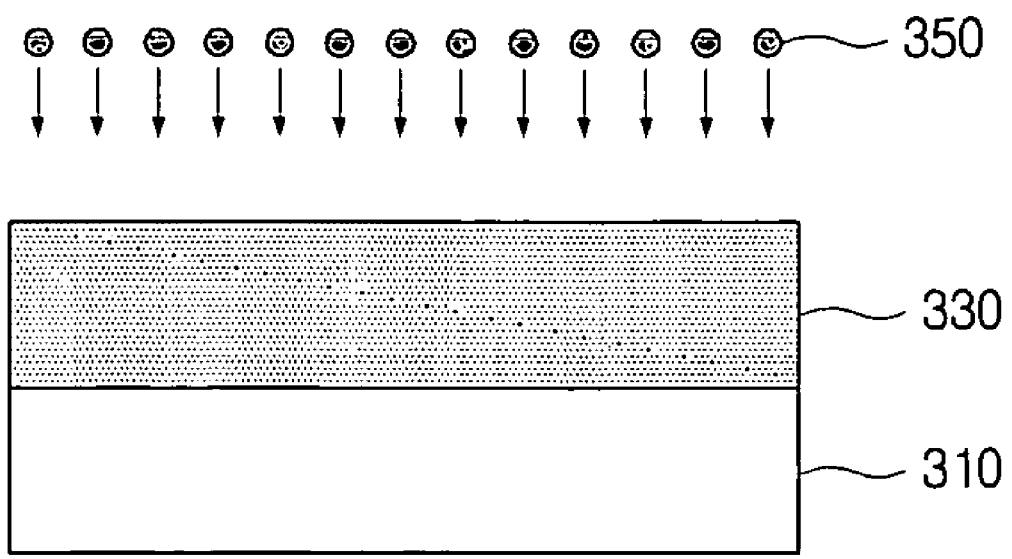
Figure 3C:
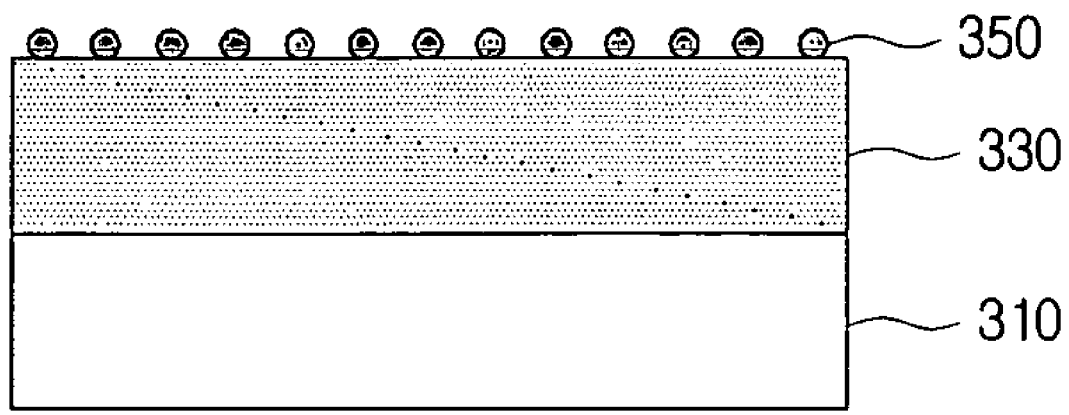
Figure 3D:
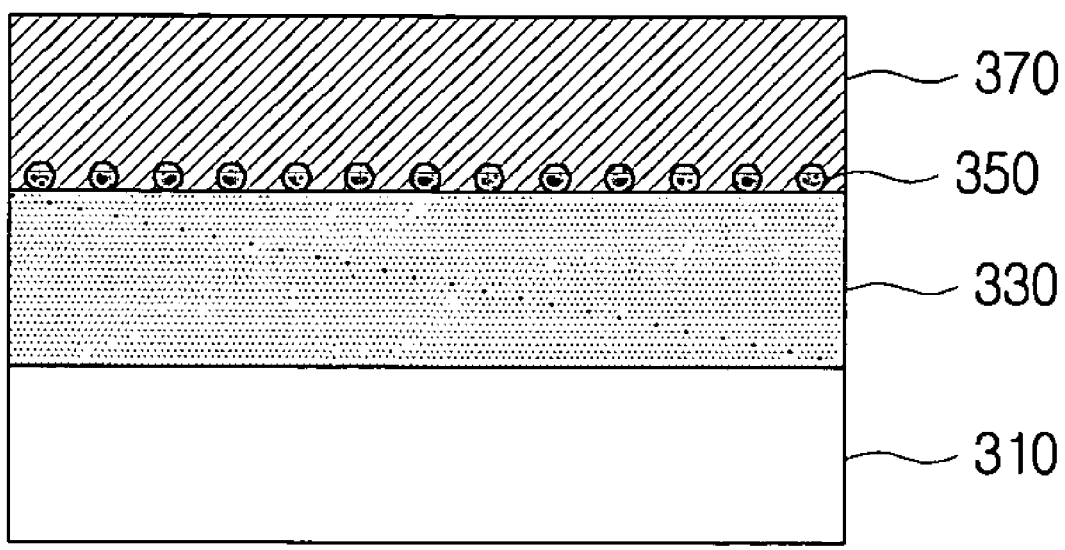
Figure 4A:
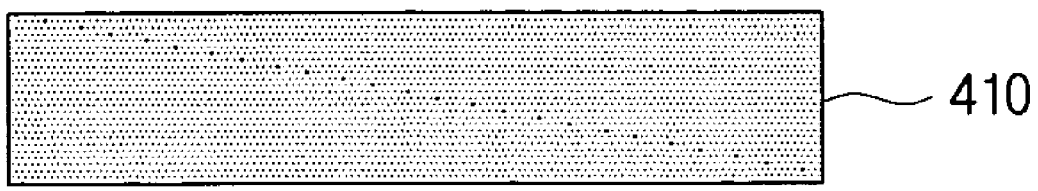
FIGS. 4A to 4C are schematic diagrams illustrating a method of plating an insulating substrate using an aerosol of metal nanoparticle according to one embodiment of the present invention.
Figure 4B:
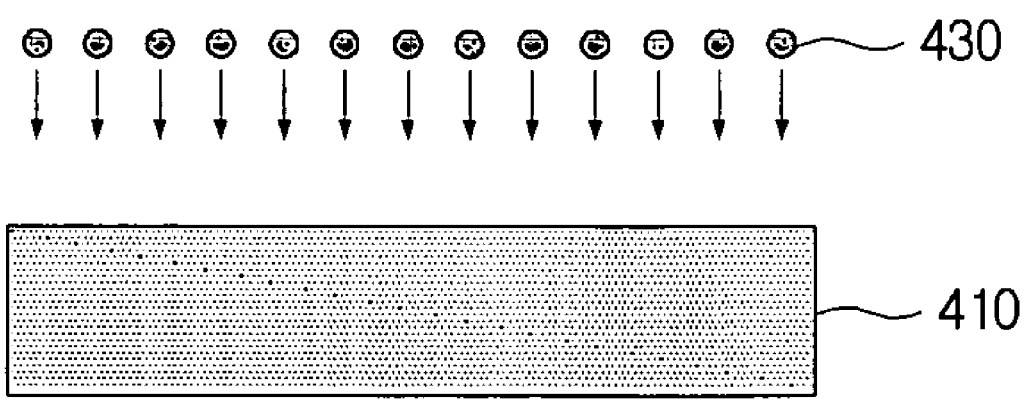
Figure 4C:
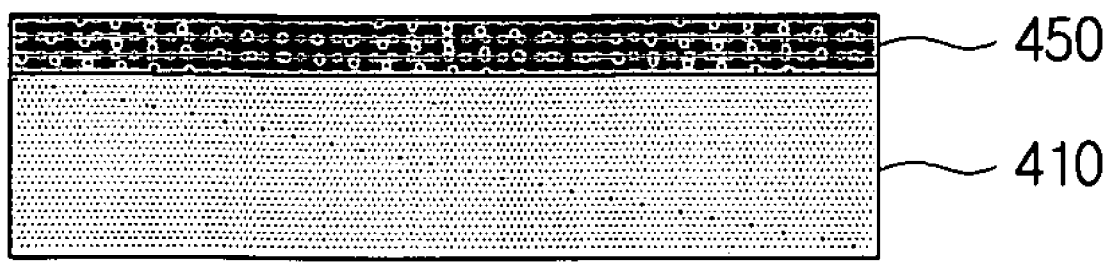

Hereinafter, according to the present invention, the method for forming photoresist-laminated substrate, method for plating insulating substrate, method for surface treating metal layer of circuit board, and method for manufacturing multi layer ceramic condenser using metal nanoparticles aerosol will be described in detail.

FIGS. 3A to 3D are schematic diagrams illustrating a method of forming a photoresist-laminated substrate according to one embodiment of the present invention.

Illustrating with FIGS. 3A to 3D, a method for forming a photoresist-laminated substrate according to an aspect of the invention includes: preparing a laminated substrate having an insulating substrate 310 and a metal layer 330; coating with an aerosol of metal nanoparticles 350 on the metal layer 330; and laminating a photoresist film 370 on the metal layer 330 coated with the aerosol of metal nanoparticles 350.

As the invention is for improving the adhesion between the metal layer and the photoresist film in the manufacturing of a printed circuit board, fine roughness is formed by applying the aerosol of metal nanoparticles between the insulating substrate 310 and the photoresist film 370, so that the photoresist film 370 may adhere more closely and residual materials may be eliminated surely when the photoresist film 370 is removed, comparing with when the roughness is formed using etching.

According to an embodiment, a diameter of metal nanoparticles is 0.001 to 10 μm. If the diameter of metal nanoparticles is less than 0.001 μm, the adhesion with the dry film is deteriorated due to lowered surface roughness of the metal. If the diameter of metal nanoparticles is more than 10 μm, control of particle uniformity becomes difficult and the adhesion with the first applied metal layer is deteriorated. The diameter of metal nanoparticles may be 0.001 to 1 μm for forming fine circuits.

Also, a pitch between the metal nanoparticles in the aerosol may be 0.001 to 20 μm. If the pitch between the metal nanoparticles is less than is 0.001 μm, the adhesion of the photoresist film is deteriorated because of non-uniformed metal layer. If the pitch between the metal nanoparticles is more than is 20 μm, the adhesion is deteriorated with the reduction of contact surface between the metal layer and the photoresist film.

The metal nanoparticles may be at least one selected from the group consisting of copper, aluminum, nickel, tin, platinum, palladium, silver, gold, titanium, tantalum, tungsten, and their alloys. Here, the metal is selected which shows excellent absorption ability with the metal layer, for example copper nanoparticles are used when a copper layer is used.

According to the invention, the aerosol of metal nanoparticles can be manufactured by various methods including hot thermal spray method and cold thermal spray method. In the process of manufacturing, condensing and coating of minute particles and the process of melting, cohering and coating of the minute particles by use of a laser, if it is sprayed in a liquid form, it is the hot thermal spray method and if it is in solid particles, it is the cold thermal spray method.

In the step of coating with aerosol of metal nanoparticles, an electric filed may be applied in order to coat with the aerosol of metal nanoparticles uniformly and provide coating efficiency. When the photoresist-laminated substrate is formed by applying the aerosol of metal nanoparticles like this, because the wet method such as etching is eliminated and the dry method is used, it is environmentally friendly, provides the close adhesion between the metal layer and the photoresist film, and reduces the residual materials, which further allows convenience to eliminate the photoresist film after forming wirings on the printed circuit board.

FIGS. 4A to 4D are schematic diagrams illustrating a method of plating an insulating substrate according to another embodiment of the present invention. Illustrating with FIGS. 4A to 4D, a method for plating an insulating substrate according to another aspect of the invention includes preparing an insulating substrate 410; and forming a metal seed layer 450 by coating with an aerosol of metal nanoparticles 430 on one side of the insulating substrate 410.

Herein, the insulating substrate 410 can be one of ceramic material and semiconductor material. Namely, any semiconductor, nonconductor and the like can be used.

The metal nanoparticles which are used of coating the insulating substrate may be at least one selected from the group consisting of copper, aluminum, nickel, tin, platinum, palladium, silver, gold, titanium, tantalum, tungsten, and their alloys and a diameter of the metal nanoparticles can be 0.001 to 10 μm. If a diameter of the metal nanoparticles is less than 0.001 μm, it is not preferable because the rate of forming a layer is too slow and if a diameter of the metal nanoparticles is more than 10 μm, the electroplating layer can be defective because of serious non-uniformity of the layer.

The aerosol of metal nanoparticles 430 is coated same as the method mentioned above. In the step of coating with the aerosol of metal nanoparticles, the electric field may be applied to coat uniformly and to improve application efficiency.

When the metal seed layer 450 is formed by coating with the aerosol of metal nanoparticles 430, electroless plating process, which is required to form a thin metal layer prior to conduct the electroplating on the insulating substrate in the conventional method, can be completely eliminated. Also there are many restrictive factors to form thickness of an electric conduction layer with the electroless plating method, while the coating with the aerosol of metal nanoparticles according to the invention may allow a thickness of the metal seed layer of 0.01 to 200 μm. If the thickness of the metal seed layer is less than 0.01 μm, it deteriorates the weatherabililty and conductivity during the formation of a post-layer by electroplating On the other hand, if the thickness of the metal seed layer is more than 200 μm, it is not preferable to form a fine circuit because non-uniformity of etched surface increases during the serial process of applying a photosensitivity insulating material, exposing, developing and etching.

The method for plating an insulating substrate according to the invention may further include forming a metal conductive layer on the metal seed layer by the electroplating method. The method for plating an insulating substrate of the present invention may further include forming a circuit pattern on the metal seed layer, in which the step of forming a circuit pattern includes laminating a photoresist film, exposing, developing, electroplating, peeling and etching. The method for plating an insulating substrate according to the invention may further include forming a post-film by coating with the aerosol of metal nanoparticles on the metal seed layer and forming a circuit pattern, in which the forming a circuit pattern may include laminating a photoresist film, exposing, developing, electroplating, peeling and etching.

According to another aspect of the invention, a method for surface treating of a metal layer of a circuit board may include preparing a circuit board having an insulating substrate and a metal layer laminated on the insulating substrate; forming a first metal layer on the metal layer by coating with a first aerosol of metal nanoparticles; and forming a second metal layer on the first metal layer by coating with a second aerosol of metal nanoparticles.

Figure 5:
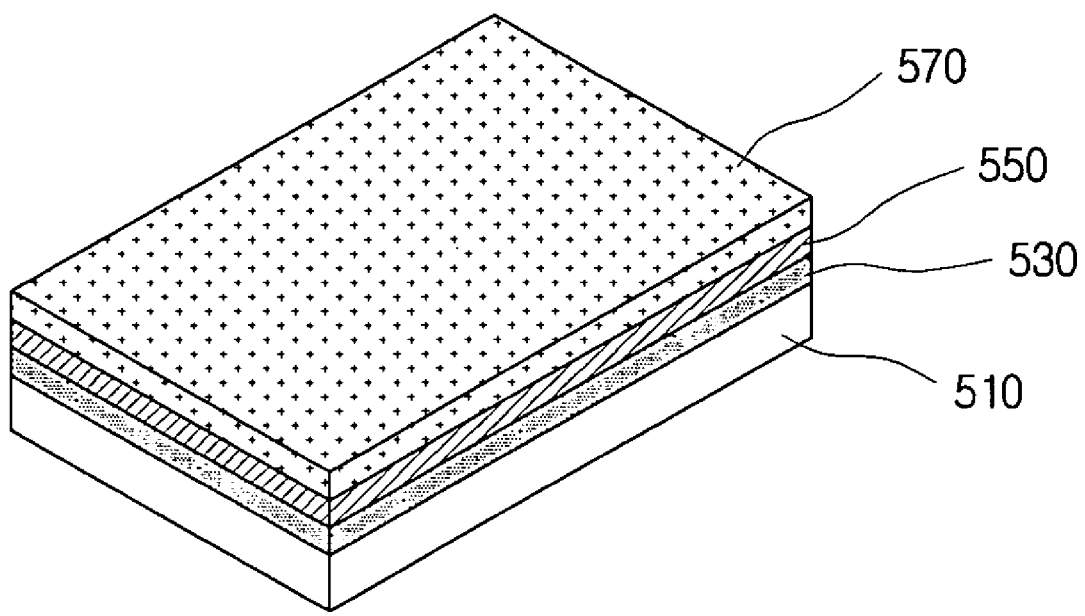
FIG. 5 is a sectional diagram of a circuit board surface-treated on a metal layer according to one embodiment of the present invention.

FIG. 5 is a sectional diagram of a surface-treated circuit board according to another embodiment of the present invention.

Illustrating with FIG. 5, a metal layer 530 laminated on an insulating substrate 510 can be a copper layer or copper alloy layer and a first metal layer 550 is formed on the metal layer 530 and a second metal layer 570 is formed on the first metal layer 550.

The first metal nanoparticles and the second metal nanoparticles used in the first metal layer 550 and the second metal layer 570, respectively are independently at least one selected from the group consisting of copper, aluminum, nickel, tin, platinum, palladium, silver, gold, titanium, tantalum, tungsten, and their alloys, and the metal nanoparticles in the first aerosol be different from the metal nanoparticles in the second aerosol. For example, the first metal nanoparticles can be nickel nanoparticles and the second metal nanoparticles can be gold nanoparticles.

A diameter of the first metal nanoparticles is 0.001 to 2 μm and a thickness of the first metal layer 550 is 0.01 to 20 μm. If a diameter of the first metal nanoparticles is less than 0.01 μm, it is not preferable because the rate of forming the layer becomes slow and if a diameter of the metal nanoparticles is more than 2 μm, it is not preferable because an non-uniformed layer is formed. Also if a thickness of the first metal nanoparticles 550 is less than 0.01 μm, a long-term reliability becomes poor because the first metal nanoparticles can not fulfill its duty as a middle layer, which controls metal diffusion, between metal layers. If a thickness of the first metal nanoparticles is more than 20 μm, the non-uniformity of the surface of the coated layer increase, which can be a potential factor of forming non-uniformed layer surface in the post-process such as STM and the like.

A diameter of the second metal nanoparticles is 0.001 to 1 μm and a thickness of the second metal layer 570 is 0.003 to 1 μm. If the diameter of the second metal nanoparticles is less than 0.001 μm, the surface corrosion is caused and if the diameter of the second metal nanoparticles is more than 1 μm, it is not preferable because of forming non-uniformed layer surface in the post-process such as STM and the like. Also, if the thickness of the second metal layer 570 is less than 0.003 μm, the surface corrosion is caused, if the thickness of the second metal layer is more than 1 μm, it causes high manufacturing cost.

According to another aspect of the invention, a method for manufacturing a laminated ceramic condenser includes preparing a laminated substrate having a dielectric layer and an inner electrode; and forming an outer electrode in a particular form by coating with an aerosol of metal nanoparticles to outside the laminated substrate.

Figure 6:
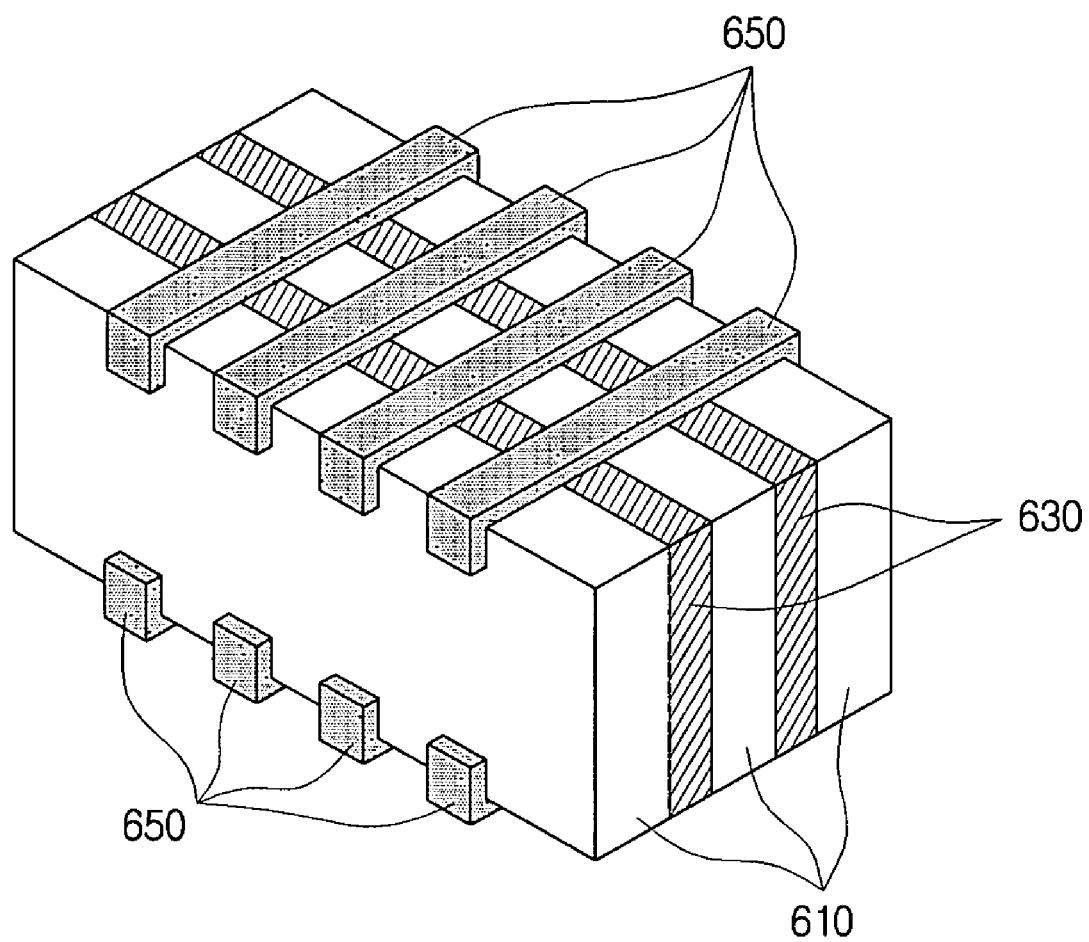
FIG. 6 is a perspective view of a multi layer ceramic condenser which is manufactured according to one embodiment of the present invention.

FIG. 6 is a perspective view of a multi layer ceramic condenser which is manufactured according to one embodiment of the present invention. In the multi layer ceramic condenser, the dielectric layer 610 and the inner electrode 630 are laminated alternatively and the outer electrode 650 in a particular form is formed outside thereof.

According to one embodiment, the metal nanoparticles for forming the outer electrode 650 is at least one selected from the group consisting of copper, aluminum, nickel, tin, platinum, palladium, silver, gold, titanium, tantalum, tungsten, and their alloys.

Here, a diameter of the metal nanoparticles can be 0.001 to 10 μm. If a diameter of the metal nanoparticles is less than 0.01 μm, it is not preferable because the rate of forming the layer is slow. If a diameter of the metal nanoparticles is more than 10 μm, mount ability decreases in the post-process such as STM and the like.

The outer electrode 650 in a particular form may be formed by coating with an aerosol of metal nanoparticles with mask. The width and thickness of the outer electrode may be defined by size of the multi layer ceramic condenser and mask.

The invention is not limited to the examples stated above and it is also apparent that more changes may be made by those skilled in the art without departing from the principles and spirit of the present invention.

What is claimed is:

1. A method for forming a photoresist-laminated substrate comprising:
   preparing a laminated substrate having an insulating substrate and a metal layer;
   coating with an aerosol of metal nanoparticles having a diameter of 0.001 to 10 μm on the metal layer, wherein a pitch between the metal nanoparticles in the aerosol is 0.001 to 20 μm;
   laminating a photoresist film on the metal layer coated with the aerosol of metal nanoparticles.

2. The method of claim 1, wherein the metal nanoparticles is at least one selected from the group consisting of copper, aluminum, nickel, tin, platinum, palladium, silver, gold, titanium, tantalum, tungsten, and their alloys.

3. The method of claim 1, wherein an electric field is applied, in the coating with the aerosol of metal nanoparticles, to coat uniformly.

4. The method of claim 1, wherein the aerosol of metal nanoparticles is coated by one method of hot thermal spray method for spraying a liquid form and cold thermal spray method for spraying solid particles, in the coating with the aerosol of metal nanoparticle.

* * * * *